US009523731B2

(12) United States Patent
Park et al.

(10) Patent No.: US 9,523,731 B2
(45) Date of Patent: Dec. 20, 2016

(54) DIAGNOSIS SYSTEM FOR MONITORING STATE OF SWITCHBOARD

(71) Applicant: LSIS CO., LTD., Anyang-si, Gyeonggi-do (KR)

(72) Inventors: Chan Yong Park, Cheongju-si (KR); Do Hoon Lee, Cheongju-si (KR); Hyun Ho Kwon, Cheongju-si (KR)

(73) Assignee: LSIS CO., LTD., Anyang-si (KR)

( * ) Notice: Subject to any disclaimer, the term of this patent is extended or adjusted under 35 U.S.C. 154(b) by 0 days.

(21) Appl. No.: 14/607,516

(22) Filed: Jan. 28, 2015

(65) Prior Publication Data

US 2015/0260778 A1    Sep. 17, 2015

(30) Foreign Application Priority Data

Mar. 17, 2014    (KR) ........................ 10-2014-0031201

(51) Int. Cl.
*G01R 15/18*    (2006.01)
*G01R 31/14*    (2006.01)

(52) U.S. Cl.
CPC .................... *G01R 31/14* (2013.01)

(58) Field of Classification Search
CPC combination set(s) only.
See application file for complete search history.

(56) References Cited

U.S. PATENT DOCUMENTS

2005/0035768 A1* 2/2005 Rabach ............... G01R 31/346
                                                    324/546
2011/0309939 A1* 12/2011 Glock .................. H02B 13/065
                                                    340/584

FOREIGN PATENT DOCUMENTS

AT    EP 0297079 A1 * 12/1988 ........... H02H 1/0069
KR    10-1303082        9/2013
KR    10-1336317        12/2013

OTHER PUBLICATIONS

Korean Intellectual Property Office Application Serial No. 10-2014-0031201, Office Action dated Feb. 13, 2015, 5 pages.

* cited by examiner

*Primary Examiner* — Walter Lindsay, Jr.
*Assistant Examiner* — Jas Sanghera
(74) *Attorney, Agent, or Firm* — Lee, Hong, Degerman, Kang & Waimey PC

(57) ABSTRACT

A diagnosis system for monitoring a status of a switchboard is provided. The diagnosis system for monitoring a status of a switchboard includes a sensor unit installed in a switchboard, wherein the sensor unit comprise a plurality of sensors sensing two or more of a partial discharge (PD) signal, a temperature signal and an acc signal and outputting each switchboard status sensing signal; a data collecting device receiving each switchboard status sensing signal corresponding to two or more of the PD signal, the temperature signal, and the arc signal from the sensor unit wherein the data collecting device collects a plurality of datums for status monitoring and diagnosis control of the switchboard based on each switchboard status sensing signal received; and a remote monitoring device performing the status monitoring and diagnosis control of the switchboard based on a plurality of measuring datums received from the data collecting device.

5 Claims, 5 Drawing Sheets

DIAGNOSIS SYSTEM FOR MONITORING STATE OF SWITCHBOARD

CROSS-REFERENCE TO RELATED APPLICATIONS

Pursuant to 35 U.S.C. §119(a), this application claims the benefit of earlier filing date and right of priority to Korean Patent Application No. 10-2014-0031201, filed on Mar. 17, 2014, the contents of which are hereby incorporated by reference herein in its entirety.

BACKGROUND

The present disclosure relates to a diagnosis system for monitoring the status of a switchboard, and more particularly, to a diagnosis system for monitoring the status of a switchboard that may early detect a sign experiencing insulation breakdown due to deterioration or the weakening of mechanical coupling by internal and external factors (electrical, thermal, chemical stress and vibration, and environmental factors) of the switchboard, and eventually leading to an accident to prevent the spread of the accident.

Many electrical apparatuses for power conversion, transmission and measurement are arranged in a switchboard. However, these electrical devices may experience insulation breakdown due to deterioration or weakening of mechanical coupling by internal and external factors (electrical, thermal, chemical stress and vibration, and environmental factors) and eventually cause an accident.

In a typical method for the status diagnosis of the switchboard, a single partial discharge sensor or temperature sensor module is attached for monitoring.

The partial discharge sensor is installed mostly as an ultra high frequency (UHF) sensor in the switchboard and detects an electromagnetic signal emitting when partial discharge PD due to the insulation deterioration of a mold transformer in the switchboard occurs. A detected partial discharge signal is processed through a dedicated data processing apparatus and whether the partial discharge signal has been generated and the size of the signal are transmitted to a higher diagnosis system.

The temperature sensor is attached to a busbar in the switchboard to measure the temperature of the busbar by using a contact type or non-contact type sensor, and a measured temperature is processed in its own unit module and transmitted to a higher diagnosis system. The higher diagnosis system diagnoses the status of the switchboard based on each of data transmitted.

In addition, many sensors are attached as a monitor device for preventing the trouble of the mold transformer in the switchboard and an earth-side high frequency current transformer (HFCT) sensor that is easily attached on a hot line is mostly used.

FIG. 1 depicts a method of measuring a partial discharge signal generated in a mold transformer in a switchboard by using a typical HFCT sensor.

Referring to FIG. 1, as insulation deterioration occurs in a mold transformer 1 installed in the switchboard, a PD signal 2 is internally generated.

The PD signal generated in the mold transformer 1 flows along an earth wire 4 connected to a transformer base 3.

The PD signal 2 flowing along the earth wire 4 is detected by the HFCT sensor 5, a measuring sensor to be displayed by an oscilloscope or a data obtaining device 6 that may check signals.

As such, since the PD measuring method using the HFCT attaches a sensor to the earth wire by using a clamp type and thus it is possible to install a sensor and measure a signal even in a hot line status, the PD measuring method using the HFCT is being widely used.

However, in measuring the PD signal flowing in the earth wire, the signal is weak and thus is easily affected by external noise, and it is substantially difficult to detect a signal due to a noise signal even if micro discharge occurs.

Thus, in diagnosing the status of the mold transformer in the switchboard, it takes long times to determine internal deterioration and in determining precise diagnosis and produce replacement periods.

As such, typical switchboard diagnosis systems include a single (partial discharge, temperature) sensor and thus are significantly insufficient for precisely diagnosing the status of the switchboard.

In the case of the UHF sensor, it is installed without a cover in the external box of the switchboard and thus vulnerable to external radiation noise. Also, in the case of a sensor having lower sensitivity among UHF sensors having different sensitivity characteristics, it is difficult to detect a discharge signal at an early status of insulation deterioration and in some cases, it is possible to detect the discharge signal after deterioration has significantly progressed and shortly before an accident.

When a PD signal is detected in the UHF sensor, there are many difficulties in determining whether the signal is a signal generated actually in an electrical apparatus or an external noise signal.

In the case of a temperature sensor installed at the center of the busbar, since the temperature of a conducted busbar is measured, there is a difficulty in measuring and diagnosing the temperature of an actually overheated electrical apparatus and a coupling part. The reason for this is because an accident due to overheat occurs more frequently on a bolt coupling part or a conductor-conductor coupling part than the center of the busbar.

SUMMARY

Embodiments provide a diagnosis system for monitoring the status of a switchboard, and more particularly, to a diagnosis system for monitoring the status of a switchboard that may early detect a sign experiencing insulation breakdown due to deterioration or the weakening of mechanical coupling by internal and external factors (electrical, thermal, chemical stress and vibration, and environmental factors) of the switchboard, and eventually leading to an accident to prevent the spread of the accident.

In one embodiment, a diagnosis system for monitoring a status of a switchboard includes a sensor unit installed in a switchboard, wherein the sensor unit comprise a plurality of sensors sensing two or more of a partial discharge (PD) signal, a temperature signal and an acc signal and outputting each switchboard status sensing signal; a data collecting device receiving each switchboard status sensing signal corresponding to two or more of the PD signal, the temperature signal, and the arc signal from the sensor unit wherein the data collecting device collects a plurality of datums for status monitoring and diagnosis control of the switchboard based on each switchboard status sensing signal received; and a remote monitoring device performing the status monitoring and diagnosis control of the switchboard based on a plurality of measuring datums received from the data collecting device.

The sensor unit may include two or more of a PD sensor, a temperature sensor and a light receiving sensor.

The PD sensor may include a ultra high frequency (UHF) sensor, a transient earth voltage (TEV) sensor, a high frequency current transformer (HFCT), an L sensor, or a coupling capacitor.

The data collecting device may include a PD signal processing module processing a switchboard status monitoring signal corresponding to the PD signal received from the PD sensor to transmit a processed signal as measuring data and event data to the remote monitoring device; a temperature signal processing module processing a switchboard status monitoring signal corresponding to the temperature signal received from the temperature sensor to transmit a processed signal as measuring data and event data to the remote monitoring device; and an arc signal processing module processing a switchboard status monitoring signal corresponding to the arc signal received from the light receiving sensor to transmit a processed signal as measuring data and event data to the remote monitoring device.

The data collecting device may be installed separately from the switchboard to receive a switchboard status monitoring signal received from the switchboard and transmit a received signal to the remote monitoring device.

The data collecting device may be configured to receive each switchboard status monitoring signal received from a plurality of switchboards and transmit a received signal to the remote monitoring device.

The data collecting device may receive each switchboard status monitoring signal received from a plurality of switchboards and transmit a received signal to the remote monitoring device.

According to embodiments, by complexly applying optimal sensors suitable for monitoring the statuses of an electrical device, a busbar and a coupling structure to a typical diagnosis system including a single sensor (UHF or temperature) for monitoring the status of a switchboard, it is possible to enhance precision in measuring a signal having the sign of a trouble, early detect the sign of an accident in the switchboard and prevent the spread of the accident.

That is, in order to decrease a measuring error in monitoring the status of the switchboard and perform more precise diagnosis, it is possible to perform complex diagnosis through a PD sensor (UHF, HFCT, L sensor, or coupling capacitor), a (contact type or infrared ray (IR)) temperature sensor, and a light receiving sensor (arc detection) instead of the single sensor.

Also, by widening monitoring targets in addition to the busbar, mold transformer and cable in the switchboard, it is possible to apply to most of devices in the switchboard such as CT, PT, VCB, and power fuse (PF). Thus, it is possible to perform complex diagnosis on the CT, PT and VCB that are the reasons for accidents in addition to the busbar and the mold transformer, and frequently experience.

As such, by classifying the deterioration of electrical devices by electrical stress or heat in the switchboard and attaching an optimal sensor to each of them, it is possible to shorten a time taken to determine a wrong device in the switchboard and more quickly perform status diagnosis and measure on the electrical devices in the switchboard.

Also, since the data collecting device for diagnosis includes the PD signal processing module, the arc signal processing module, and the temperature signal processing module, it is possible to enhance the reliability of a diagnosis result.

Also, since status diagnosis on each electrical device in the switchboard is more clearly performed, it is possible to decrease a possibility to lead to a switchboard related accident and furthermore prevent a power failure accident and industrial disaster due to a power system accident.

DETAILED DESCRIPTION OF THE EMBODIMENTS

Exemplary embodiments are described below in detail with reference to the accompanying drawings. However, it may not be said that the spirit of the present invention is limited to presented embodiments, and it is possible to easily propose, by the addition, change or deletion of components, other retrogressive inventions or other embodiments included in the spirit of the present invention.

The terms used herein are selected with general terms currently, widely used if possible, but in particular cases, terms arbitrarily selected by the applicant are used and in these cases, since their meanings are described in detail in corresponding parts of the detailed description, it should be noted that the present invention needs to be understood with the meanings of the terms, not the names of the terms.

That is, in the following description, the word "including" does not exclude the presence of components or steps other than those enumerated.

Figure 1:
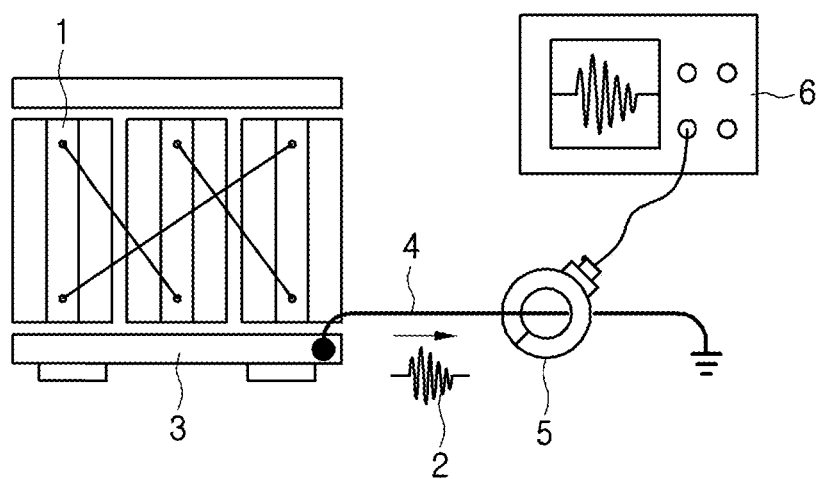
FIG. 1 depicts a method of measuring a partial discharge (PD) signal generated in a mold transformer in a switchboard by using a typical HFCT sensor.
Figure 2:
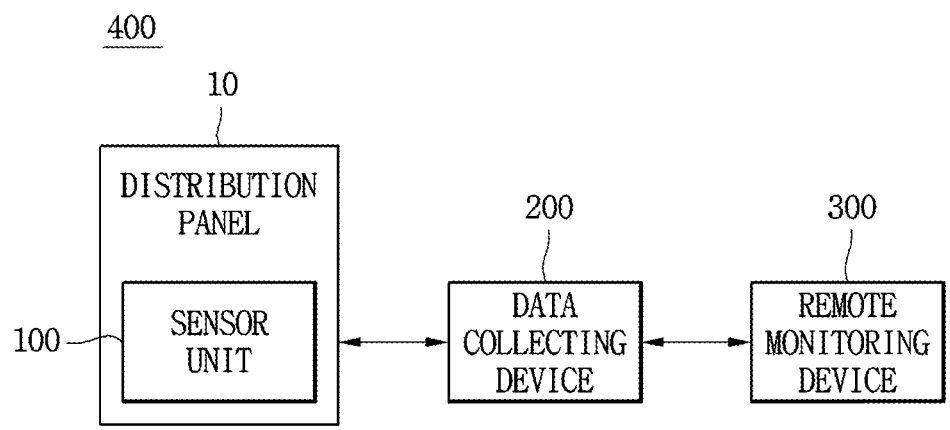
FIG. 2 is a block diagram of a diagnosis system for monitoring the status of a switchboard according to an embodiment.
Figure 3:
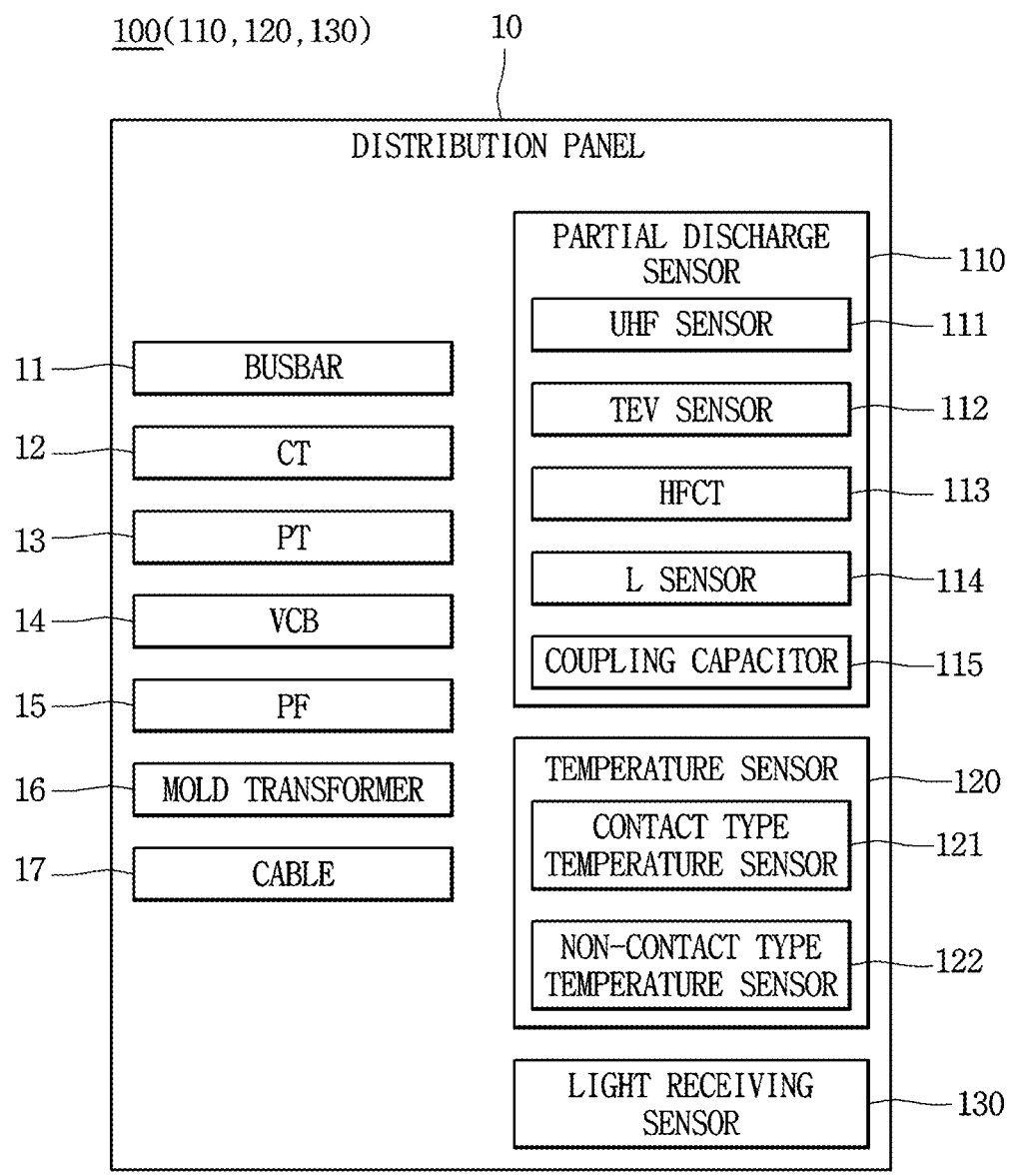
FIG. 3 is a block diagram of a switchboard according to an embodiment.
Figure 4:
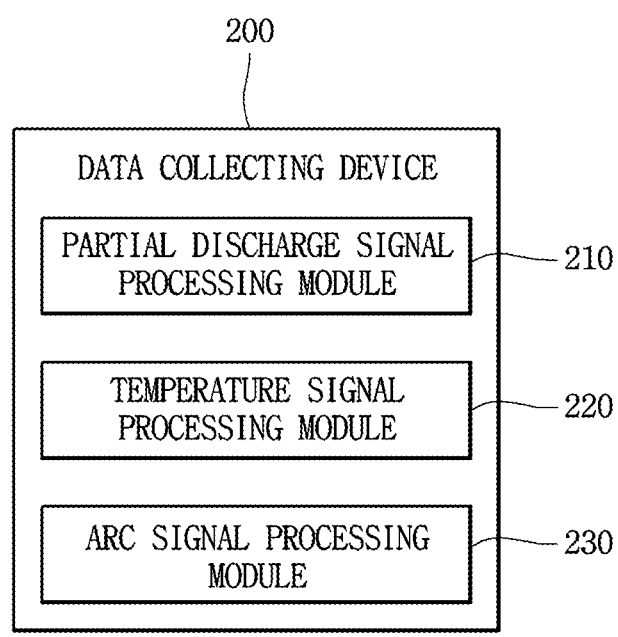
FIG. 4 is a block diagram of a data collecting apparatus according to an embodiment.

FIG. 2 is a block diagram of a diagnosis system for monitoring the status of a switchboard according to an embodiment. FIG. 3 is a block diagram of a switchboard according to an embodiment. FIG. 4 is a block diagram of a data collecting apparatus according to an embodiment.

Referring to FIGS. 2 and 3, a diagnosis system 400 for monitoring the status of a switchboard according to an embodiment may include a sensor unit 100 including a plurality of sensors installed in a switchboard 10, a data collecting device 200, and a remote monitoring device 300.

The sensor unit 100 is installed in the switchboard 10, senses two or more of a partial discharge (PD) signal, a temperature signal, and an arc signal that are generated in the switchboard 10, and outputs each status sensing signal of the switchboard.

The data collecting device 200 receives each status sensing signal of the switchboard corresponding to two or more of the PD signal, temperature signal, and arc signal from the sensor unit 100, performs signal processing, collects a plurality of measurement datums for the status monitoring and diagnosis control of the switchboard 10, and transmits collected data to the remote monitoring device 300.

The remote monitoring device 300 may receive the plurality of measurement datums from the data collecting unit 200 to perform the status monitoring and diagnosis control of the switchboard 10.

The switchboard 10 may include various electrical devices such as a busbar 11, a CT 12, a PT 13, a VCB 14, a power fuse (PF) 15, a mold transformer 16, and a cable 17.

A plurality of sensors 100 for detecting a trouble related signal from each electrical device when various electrical devices 11 to 17 show insulation deterioration and the sign of trouble may be attached to the switchboard 10.

The plurality of sensors 100 may include a PD sensor 110, a temperature sensor 120, and a light receiving sensor 130.

The PD sensor 110 may include an ultra high frequency (UHF) sensor 111, a transient earth voltage (TEV) sensor 112, a high frequency current transformer (HFCT) 113, an L sensor 114, and a coupling capacitor 115.

The UHF sensor 111 is of a spiral antenna type and may be installed on the internal wall of the switchboard 10. The UHF sensor 111 may also be installed in an external box of the mold transformer 16.

The UHF sensor 111 may detect overall PD signals (radiated electromagnetic waves) generated in the switchboard 10. In order to increase the accuracy of signal detection, a plurality of UHF sensors 111 may be arranged. The UHF sensor 111 may be installed close to a targeted device to increase the measuring sensitivity of a signal.

The TEV sensor 112 may be installed in a narrow spaced in the switchboard 10 or in the vicinity of a charging unit to measure a locally generated PD signal more precisely.

The HFCT 113 may detect a discharge signal that flows along the earth wire. The HFCT 113 may be installed in the mold transformer 16.

The HFCT 113 may estimate, through the directivity and level of a signal entering the HFCT 114, from which switchboard a signal has been generated when a plurality of switchboards 10 is connected, and estimate whether noise is internal noise that has occurred in the switchboard 10 or external noise that has occurred outside the switchboard 10.

The UHF sensor 112 may be installed in the external box of the mold transformer 16, and detects a discharge signal (electromagnetic signal) generated by insulation deterioration.

The L sensor 114 may be attached to the earth wire of the mold transformer 16 or the cable to detect a trouble related signal generated by cable deterioration.

The coupling capacitor 115 may be installed at electrical devices that include sold insulating materials. In the case of e.g., the CT 12 or the PT 13, PD may occur by non-uniform field formation due to an internal gap upon manufacturing or a crack due to impact.

The coupling capacitor 115 may detect a PD signal by using direct detection having more excellent measuring precision than the UHF sensor 111, the TEV sensor 112, than the HFCT sensor 113.

The coupling capacitor 115 has an advantage in that it is possible to detect the sign of deterioration at an early status due to more excellent sensitivity than other PD sensors.

The temperature sensor 120 may include a contact type temperature sensor 121 and a non-contact type infrared ray (IR) sensor 122.

The contact type temperature sensor 121 may be coupled to the busbar 11 to measure an increase in temperature due to load currents as a whole.

The non-contact type temperature sensor 122 may be installed at other coupling parts excluding the busbar 11 to intensively detect an increase in temperature due to the failure of coupling. The non-contact type temperature sensor 122 may include an IR sensor, for example.

The light receiving sensor 130 may perform arc detection. As the electrical devices in the display panel 10 experience insulation deterioration, an early micro PD signal may develop into arc. Thus, such an arc signal may be detected as an optical signal by the light receiving sensor 130.

The data collecting device 200 may be installed separately from the switchboard 10 to receive a switchboard status monitoring signal received from the switchboard 10 and transmit a received signal to the remote monitoring device 300.

The data collecting device 200 may be connected to the switchboard 10 through RF communication or a cable such as a BNC cable.

The data collecting device 200 may process switchboard status monitoring signals corresponding to a PD signal, temperature signal and arc signal received from a plurality of sensor units 100 in the switchboard 10 to transmit processed signals as measuring data and event data to the remote monitoring device 300 having a higher position.

Referring to FIG. 4, the data collecting device 200 may include a PD signal processing module 210, a temperature signal processing module 220, and an arc signal processing module 230.

The PD signal processing module 210 may process a switchboard status monitoring signal corresponding to a PD signal received from the PD sensor 110 in the switchboard 10 to transmit a processed signal as measuring data and event data to the remote monitoring device 300 having a higher position.

The temperature signal processing module 220 may process a switchboard status monitoring signal corresponding to a temperature signal received from the temperature sensor 120 in the switchboard 10 to transmit a processed signal as measuring data and event data to the remote monitoring device 300 having a higher position.

The arc signal processing module 230 may process a switchboard status monitoring signal corresponding to an arc signal received from the light receiving sensor 130 in the switchboard 10 to transmit a processed signal as measuring data and event data to the remote monitoring device 300 having a higher position.

Figure 5:
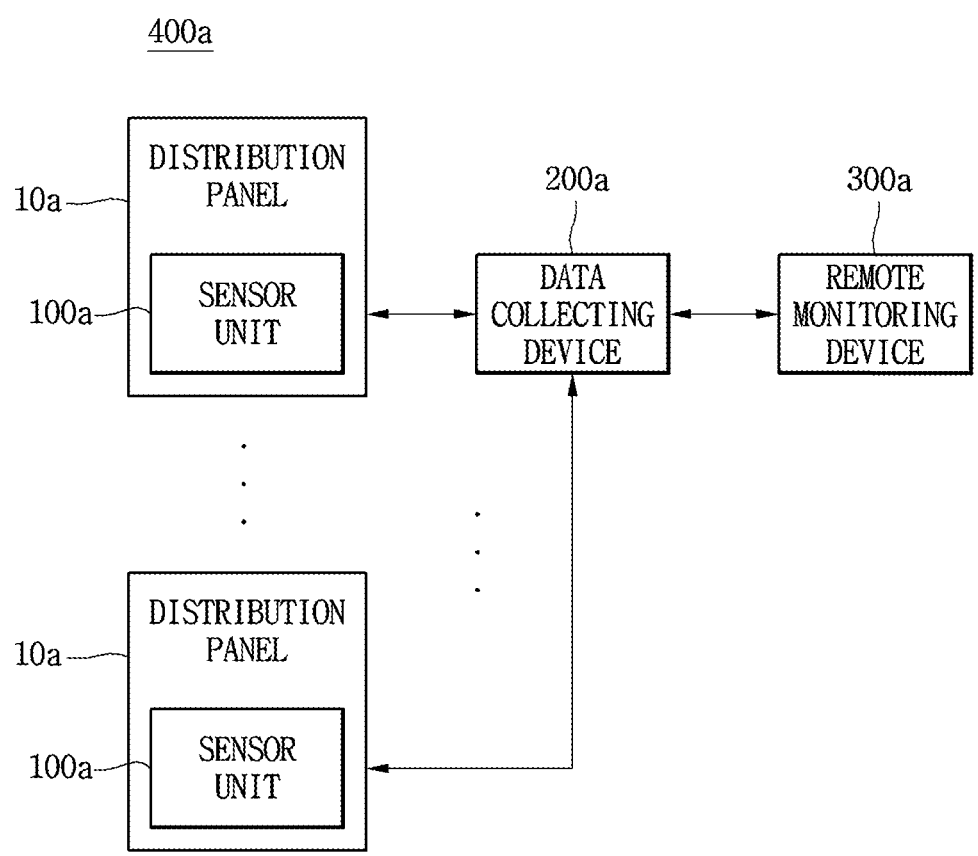
FIG. 5 is a block diagram of a diagnosis system for monitoring the status of a switchboard according to another embodiment.

FIG. 5 is a block diagram of a diagnosis system for monitoring the status of a switchboard according to another embodiment.

Referring to FIG. 5, a diagnosis system 400a for monitoring the status of a switchboard according to another embodiment may include a plurality of sensor units 100a including a plurality of sensors installed in a plurality of switchboards 10a, a data collecting device 200a, and a remote monitoring device 300a.

The data collecting device 200a is installed separately from the plurality of switchboards 10a to receive a switchboard status monitoring signal received from each of the plurality of switchboards 10a and transmit a received signal to the remote monitoring device 300.

A single data collecting device 200a may collect switchboard status monitoring signals received from the plurality of switchboards 10a and transmit collected data to the remote monitoring device 300a. In addition, in order to efficiently transmit data to the remote monitoring device 300a, the data collecting device 200a may set a priority among transmitted switchboard status monitoring signals.

For example, when a PD signal is received from a first switchboard and a temperature signal is received from a second switchboard at the same time, the data collecting device 200a may first take the PD signal received from the first switchboard according to a predetermined priority and transmit a corresponding monitoring signal to the remote monitoring device 300a and then transmit the temperature signal received from the second switchboard.

As such, when the single data collecting device 200a receives switchboard status monitoring signals from the plurality of switchboards, a configuration for easy data processing by the data collecting device may be considered.

For efficient data transmission, the data collecting device 200a may wait for a switchboard status monitoring signal from other switchboards for a certain (preset) time when a switchboard status monitoring signal is received from any one of the switchboards.

When the single data collecting device 200a manages the plurality of switchboards, the switchboards may be arranged close to one another. In this case, it is possible to monitor whether switchboard status monitoring signals are received from the plurality of switchboards for a certain time, and also transmit a signal representing emergency to the remote monitoring device 300a when the switchboard status monitoring signals are received from each of the plurality of switchboards for a certain time.

That is, information representing that a region where switchboards managed by the data collecting device 200a are dense is in an emergency is transmitted to the remote monitoring device 300a, and the remote monitoring device 300a performs control over corresponding switchboards before other data processing when a signal for such an emergency is received.

Each of the plurality of switchboards 10a includes a plurality of sensor units that sense a PD signal, temperature signal and arc signal generated in each switchboard 10a and outputs a switchboard status monitoring signal corresponding to each signal.

The data collecting device 200a may process switchboard status monitoring signals corresponding to the PD signal, temperature signal and arc signal received from the plurality of sensor units 100a in the switchboard 10a to transmit processed signals as measuring data and event data to the remote monitoring device 300a having a higher position.

Figure 6:
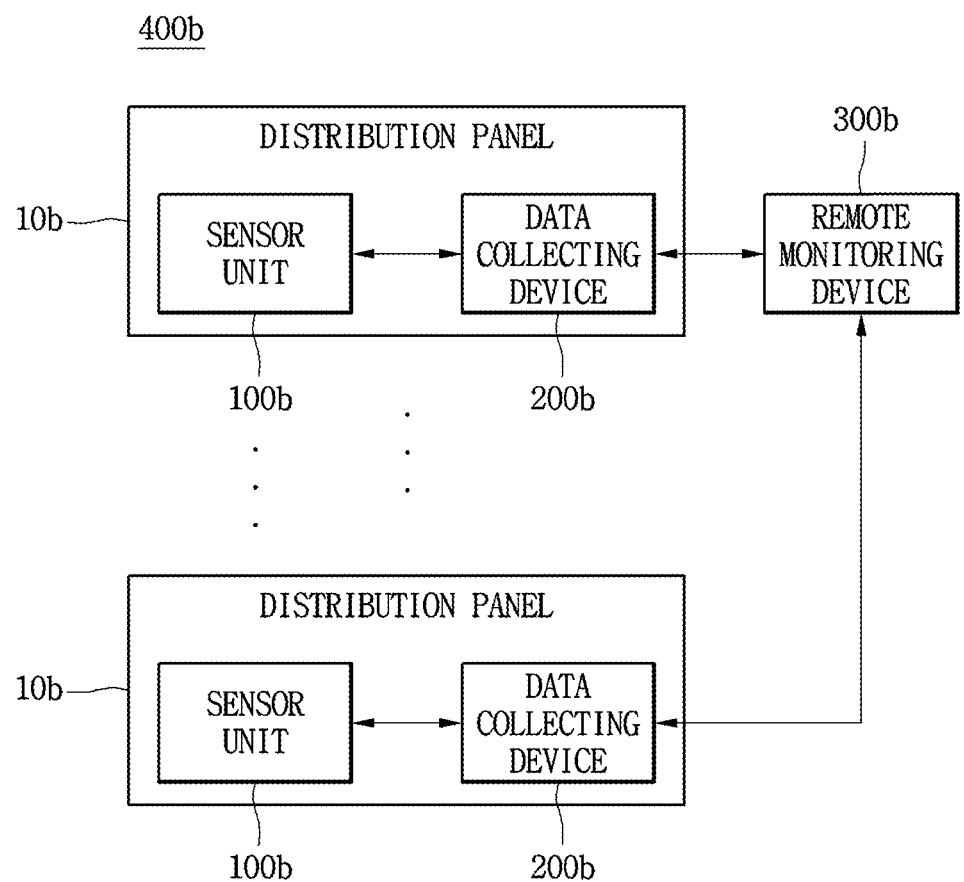
FIG. 6 is a block diagram of a diagnosis system for monitoring the status of a switchboard according to another embodiment.

FIG. 6 is a block diagram of a diagnosis system for monitoring the status of a switchboard according to another embodiment.

Referring to FIG. 6, a diagnosis system 400b for monitoring the status of a switchboard according to another embodiment may include a plurality of sensor units 100b including a plurality of sensors installed in a plurality of switchboards 10b, a plurality of data collecting devices 200b in the plurality of switchboards 10b, and a remote monitoring device 300b.

The data collecting device 200b is installed for each switchboard 10b to transmit a switchboard status monitoring signal sensed from each switchboard 10b to the remote monitoring device 300b.

When the data collecting device 200b of the present embodiment is provided for each of the switchboards, the switchboards 10b may be installed away from one another and it may be difficult to transmit switchboard status monitoring signals received from the plurality of switchboards 10b to the single data collecting device, unlike the embodiment as described in FIG. 5. On the contrary, it is possible to receive switchboard status monitoring signals from the switchboards more quickly and without loss.

When, the data collecting device 200b is provided for each of the switchboards 10b, the data collecting devices transmit collected switchboard status monitoring signals to the remote monitoring devices 300b, which may set a priority for processing received switchboard status monitoring signals depending on the type of a signal and process the signals.

For example, each of the data collecting devices sets a priority depending on the location and role of provided switchboards and when switchboard status monitoring signals are received from different data collecting devices at the same time, the remote monitoring device 300b may monitor the statuses of the switchboard and the data collecting device or perform diagnosis control according to the priority.

Each of the plurality of switchboards 10b includes a plurality of sensor units 100b that sense a PD signal, temperature signal and arc signal generated in each switchboard 10b and output a switchboard status monitoring signal corresponding to each signal.

The data collecting device 200b may process switchboard status monitoring signals corresponding to the PD signal, temperature signal and arc signal received from the plurality of sensor units 100b in the switchboard 10b to transmit processed signals as measuring data and event data to the remote monitoring device 300b having a higher position.

While particular embodiments have been described so far, many variations may be implemented without departing from the scope of the present invention. Therefore, the scope of the present invention should not be limited to the above-described embodiments but be defined by the following claims and equivalents thereof.

What is claimed is:

1. A diagnosis system for monitoring a status of a switchboard, the diagnosis system comprising:
a sensor unit installed in a switchboard and comprising a plurality of sensors configured to sense two or more of a partial discharge (PD) signal, a temperature signal, or an arc signal and to output a switchboard status sensing signal for each sensed signal;
a data collecting device configured to receive each switchboard status sensing signal from the sensor unit and collect a plurality of datums for status monitoring and diagnosis control of the switchboard based on each received switchboard status sensing signal; and
a remote monitoring device configured to perform the status monitoring and diagnosis control of the switchboard based on a plurality of measuring datums received from the data collecting device,
wherein the switchboard is provided in plurality and the data collecting device is further configured to:
collect switchboard status monitoring signals received from a plurality of switchboards; and
transmit the switchboard status monitoring signals received from the plurality of switchboards to the remote monitoring device according to a preset priority.

2. The diagnosis system according to claim 1, wherein the sensor unit comprises two or more of a PD sensor, a temperature sensor, or a light receiving sensor.

3. The diagnosis system according to claim 2, wherein the PD sensor further comprises an ultra high frequency (UHF) sensor, a transient earth voltage (TEV) sensor, a high frequency current transformer (HFCT), an L sensor, or a coupling capacitor.

4. The diagnosis system according to claim 2, wherein the data collecting device further comprises:
a PD signal processing module configured to process a switchboard status monitoring signal corresponding to the PD signal received from the PD sensor to transmit a processed signal as measuring data and event data to the remote monitoring device;

a temperature signal processing module configured to process a switchboard status monitoring signal corresponding to the temperature signal received from the temperature sensor to transmit a processed signal as measuring data and event data to the remote monitoring device; and an arc signal processing module configured to process a switchboard status monitoring signal corresponding to the arc signal received from the light receiving sensor to transmit a processed signal as measuring data and event data to the remote monitoring device.

5. A diagnosis system for monitoring a status of a switchboard, the diagnosis system comprising:

a sensor unit installed in a switchboard and comprising a plurality of sensors configured to sense two or more of a partial discharge (PD) signal, a temperature signal, or an arc signal and to output a switchboard status sensing signal for each sensed signal;

a data collecting device configured to receive each switchboard status sensing signal from the sensor unit and collect a plurality of datums for status monitoring and diagnosis control of the switchboard based on each received switchboard status sensing signal; and a remote monitoring device configured to perform the status monitoring and diagnosis control of the switchboard based on a plurality of measuring datums received from the data collecting device, wherein:

the switchboard is provided in plurality, the data collecting device is provided in plurality and corresponds to the plurality of switchboards, each of the plurality of data collecting devices is configured to transmit a collected switchboard status monitoring signal to the remote monitoring device, and the remote monitoring device is further configured to monitor the status of the switchboard or perform diagnosis control on the switchboard according to a priority preset for the switchboard status monitoring signals received from the data collecting devices.

* * * * *